(12) United States Patent
Cress et al.

(10) Patent No.: US 10,658,772 B1
(45) Date of Patent: May 19, 2020

(54) TIERED CIRCUIT BOARD FOR INTERFACING CABLES AND CONNECTORS

(71) Applicant: ADTRAN, INC., Huntsville, AL (US)

(72) Inventors: Jared D. Cress, Decatur, AL (US); Troy W. White, Owasso, OK (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 15/677,549

(22) Filed: Aug. 15, 2017

(51) Int. Cl.
| H01R 12/00 | (2006.01) |
| H05K 1/02 | (2006.01) |
| H05K 3/34 | (2006.01) |
| H01R 24/50 | (2011.01) |
| H01R 12/72 | (2011.01) |

(52) U.S. Cl.
CPC ............ *H01R 12/00* (2013.01); *H01R 12/72* (2013.01); *H01R 24/50* (2013.01); *H05K 1/0219* (2013.01); *H05K 1/0265* (2013.01); *H05K 1/0298* (2013.01); *H05K 3/3405* (2013.01)

(58) Field of Classification Search
CPC .... H05K 1/117; H05K 1/0219; H05K 1/0265; H05K 1/0298; H05K 3/3805; H01R 23/6871; H01R 12/72
See application file for complete search history.

(56) References Cited

U.S. PATENT DOCUMENTS

| 4,116,516 | A | * | 9/1978 | Griffin | .................. | H01R 12/62 |
| | | | | | | 439/493 |
| 4,674,811 | A | * | 6/1987 | Corwin | ................. | H05K 7/1007 |
| | | | | | | 439/259 |
| 4,871,608 | A | * | 10/1989 | Kondo | .................. | C03C 17/008 |
| | | | | | | 106/1.13 |
| 5,088,008 | A | * | 2/1992 | Takeyama | ........... | H01L 21/4803 |
| | | | | | | 216/18 |
| 5,219,292 | A | * | 6/1993 | Dickirson | .............. | H01R 9/096 |
| | | | | | | 439/65 |
| 5,562,971 | A | * | 10/1996 | Tsuru | ................... | H01L 21/4857 |
| | | | | | | 174/255 |
| 5,578,796 | A | * | 11/1996 | Bhatt | ................... | H01L 21/4807 |
| | | | | | | 174/252 |
| 5,766,033 | A | | 6/1998 | Davis | | |
| 5,858,145 | A | * | 1/1999 | Sreeram | .............. | B32B 37/0023 |
| | | | | | | 156/182 |

(Continued)

*Primary Examiner* — Briggitte R. Hammond
(74) *Attorney, Agent, or Firm* — Maynard, Cooper & Gale, P.C.; Jon E. Holland

(57) ABSTRACT

A connection system has a high-density, high-speed connector that is electrically connected to a plurality of cables by a tiered circuit board. Edges of the circuit board are offset in order to form steps on which conductive pads may be formed. Each set of pads on a given step may be electrically connected to one or more conductors of a cable, such as a twinax ribbon cable. Thus, each of the cables may be coupled to one or more conductive pads on a respective step of the circuit board such that a large number of conductors may be electrically interfaced with the connector in a relatively small space, unencumbered by the bend radius of the cable. In addition, the cables may be coupled to the circuit board in a manner that does not require significant bending at the ends of the cables helping to preserve signal integrity. That is, conductive paths turn at high angles (e.g., close to 90 degrees) within the circuit board rather than at the ends of the cables connected to the circuit board.

28 Claims, 5 Drawing Sheets

(56) References Cited

U.S. PATENT DOCUMENTS

| | | | |
|---|---|---|---|
| 6,050,829 A * | 4/2000 | Eldridge | G01R 1/07378 324/754.07 |
| 6,281,446 B1 * | 8/2001 | Sakamoto | H01L 23/13 174/255 |
| 6,324,067 B1 * | 11/2001 | Nishiyama | H05K 1/165 174/262 |
| 6,479,765 B2 * | 11/2002 | Ramey | H05K 1/117 174/262 |
| 6,535,397 B2 | 3/2003 | Clark et al. | |
| 7,280,372 B2 | 10/2007 | Grundy et al. | |
| 7,281,952 B2 * | 10/2007 | Kinsley | H01R 12/58 439/632 |
| 7,381,061 B2 | 6/2008 | Hung et al. | |
| 7,466,021 B2 | 12/2008 | Fjelstad | |
| 7,646,091 B2 | 1/2010 | Othieno et al. | |
| 8,475,177 B2 | 7/2013 | Crofoot et al. | |
| 8,492,655 B2 | 7/2013 | Gundel | |
| 8,696,378 B2 * | 4/2014 | Behziz | H01R 12/53 439/497 |
| 8,842,688 B2 | 9/2014 | Vahdat et al. | |
| 2002/0094705 A1 | 7/2002 | Driscoll et al. | |
| 2005/0016764 A1 * | 1/2005 | Echigo | H05K 3/4069 174/256 |
| 2006/0151198 A1 | 7/2006 | Bracaleone | |
| 2009/0034218 A1 | 2/2009 | Hu | |
| 2009/0038836 A1 * | 2/2009 | Takahashi | H05K 1/148 174/261 |
| 2009/0121336 A1 * | 5/2009 | Kim | H01L 24/49 257/686 |
| 2010/0159193 A1 * | 6/2010 | Young | B41J 2/14233 428/137 |
| 2011/0147069 A1 * | 6/2011 | Quackenbush | H05K 1/183 174/266 |
| 2014/0291002 A1 | 10/2014 | Lin et al. | |

* cited by examiner

TIERED CIRCUIT BOARD FOR INTERFACING CABLES AND CONNECTORS

RELATED ART

As telecommunications systems continue to evolve, the amount of bandwidth needed to carry an ever-increasing amount of data continues to increase. Many of these telecommunications systems rely on printed circuit boards and modules that are typically installed in a chassis, or other card cage, to perform various communication functions. As the bandwidths of these telecommunications systems increase, it is necessary to have the ability to carry larger bandwidths between the printed circuit board (PCB) modules within the chassis. Solutions in use today to achieve NRZ (non-return to zero) signal bandwidths of approximately 25 Giga-bits-per-second (Gbps) and higher generally require expensive connectors and low dielectric loss PCB materials. Bit rates beyond 25 Gbps generally require more complex transceivers capable of multi-level modulation to traverse backplane distances.

As an alternative architecture to the traditional PCB backplane, in some instances, twinaxial ("twinax") cables may become the preferred interconnect, as twinax afford much lower dissipation factors than PCB materials. However, working with large amounts of twinaxial cable introduces new challenges. For instance, where high-density interconnect is required, the bulk of many cables makes tight bend radii difficult or impossible to achieve; and even where sheer bulk is not a constraint, too sharp a bend can compromise the transmission characteristics of the cable. Furthermore, working with many individual coaxial cables can be unwieldy. In certain instances, "ribbonizing" the twinaxial cables provides an advantage as shown by FIG. 1, where multiple conductors 22 (e.g., wires) are positioned within insulative sheath 7 for enabling the conductors 22 to be connected in bulk to other components. Such ribbonized twinaxial cables, sometimes referred to as "twinaxial ribbon cables," can easily bend in a first axis (e.g., the Z axis of FIG. 1), but cannot easily bend in a second axis (e.g., the Y axis of FIG. 1). Thus, a heretofore unaddressed need exists in the art for an enhanced method to interface PCB linecards that install in chassis to a multiplicity of twinaxial cables that afford greater capacity than traditional backplanes.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for interfacing connectors with one or more cables, such as a twinax ribbon cables. In one exemplary embodiment, a high-density, high-speed connector is connected to a tiered circuit board board, such as a printed circuit board (PCB), that serves as an interface between such connector and one or more cables. Edges of the tiered circuit board are offset in order to form steps on which conductive pads may be formed. Each set of pads on a given step may be electrically connected to one or more conductors of a ribbon cable, such as a twinax ribbon cable, or other types of cables. Thus, in one exemplary embodiment, each of a plurality of ribbon cables may be coupled to conductive pads on a respective step of the tiered circuit board such that a large number of conductors may be electrically interfaced with the tiered circuit board in a relatively small space. In addition, the ribbon cables may be coupled to the tiered circuit board in a manner that permits the ends of the ribbon cables to be substantially parallel to each other such that tight bends in the ribbon cables near the connector are not required, helping to preserve signal integrity and creating a more compact high-density interconnection.

Figure 1:
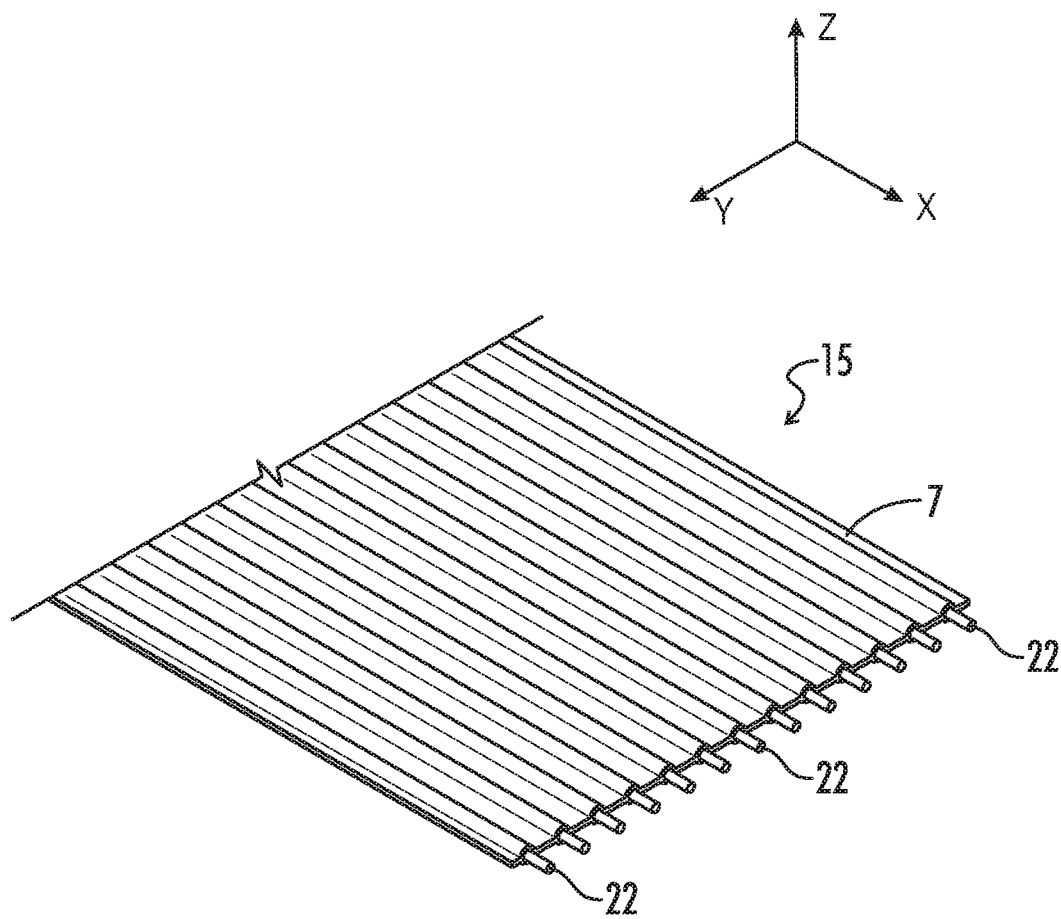
FIG. 1 is a perspective view of a conventional twinaxial ribbon cable.
Figure 2:
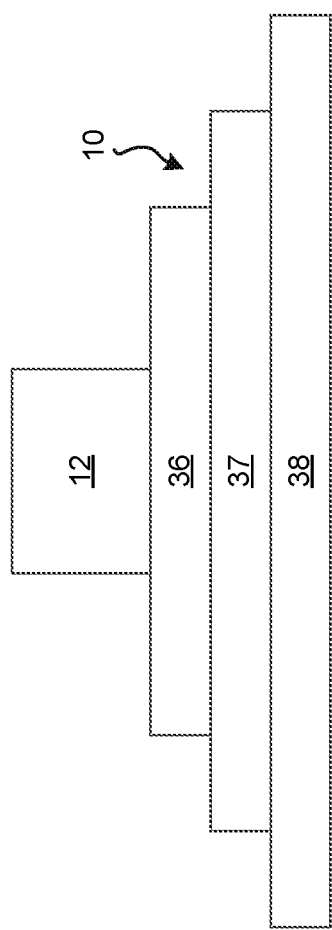
FIG. 2 is a side view illustrating an exemplary embodiment of a tiered circuit board for interfacing signals between a plurality of conductors and a connector.
Figure 3:
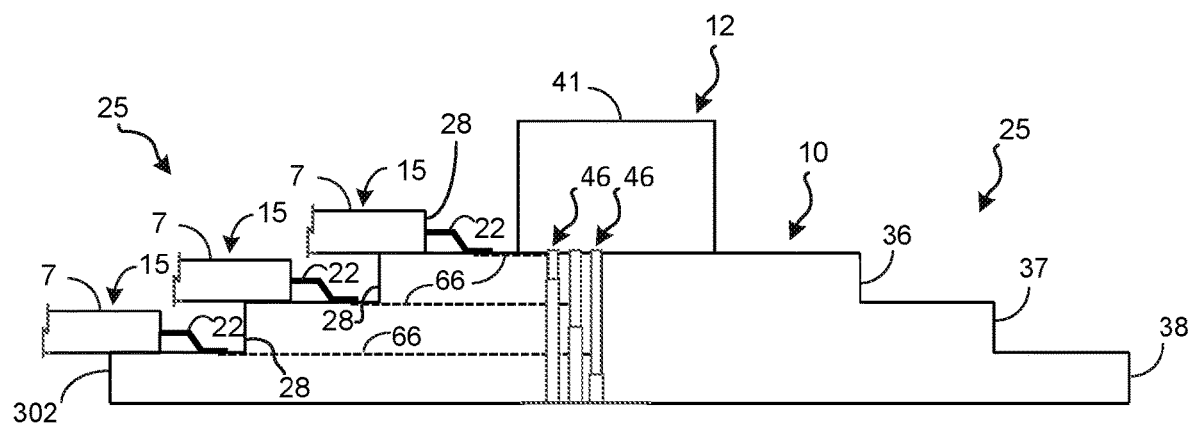
FIG. 3 is a side view of the tiered circuit board of FIG. 2 connected to a plurality of twinaxial ribbon cables with three vias within the tiered circuit board shown for illustrative purposes.
Figure 4:
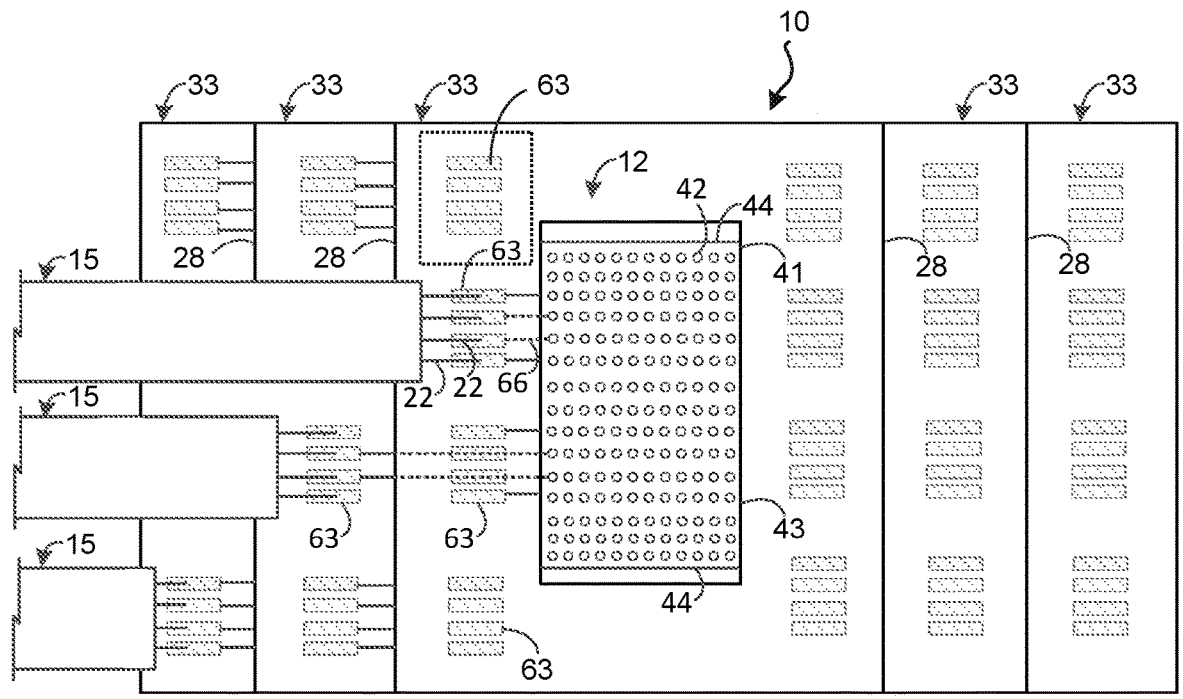
FIG. 4 is a top view of the tiered circuit board depicted by FIG. 3.
Figure 5:
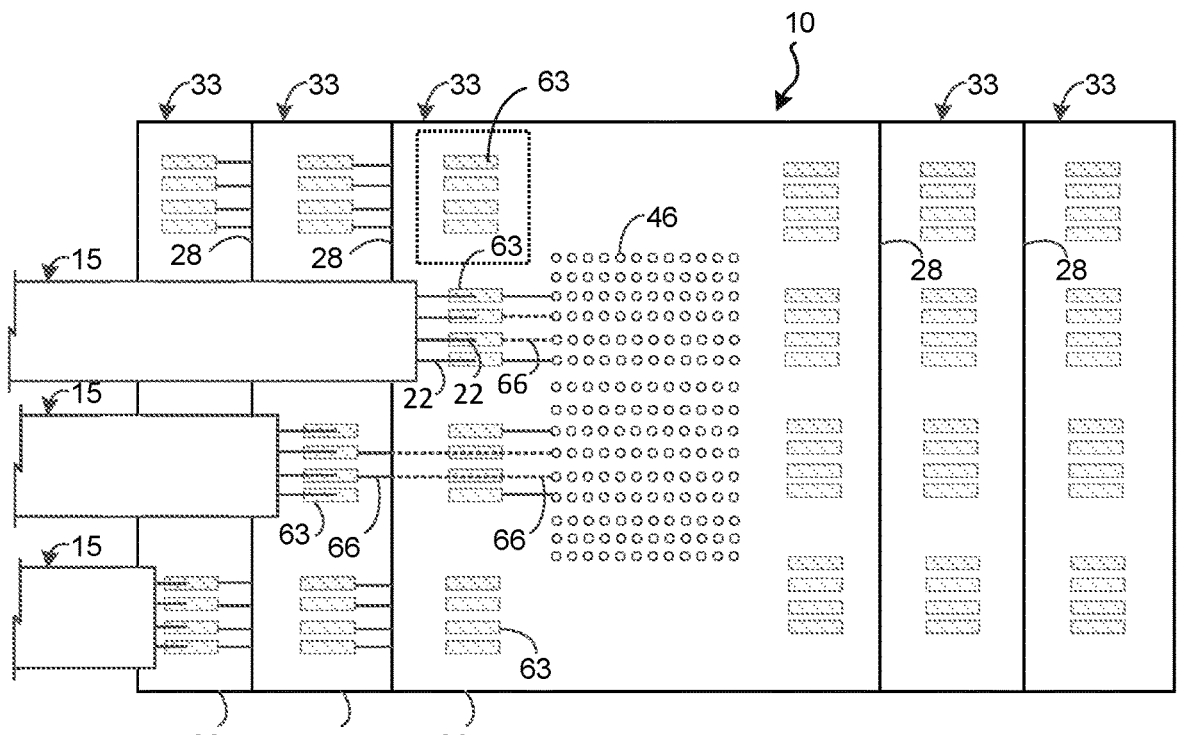
FIG. 5 is a top view of the tiered circuit board depicted by FIG. 4 with the connector removed for illustrative purposes, thereby exposing vias within the tiered circuit board.

FIGS. 2-4 depict an exemplary embodiment of a tiered circuit board 10 for interfacing a high-density, high-speed connector 12 with one or more cables 15, although other types of connectors may be used in other embodiments. As used herein, "high speed" generally refers to data rates of about 25 Gbps or higher, but the signals carried by the connector 12 may be at other speeds, if desired. FIG. 5 shows the tiered circuit board 10 with the connector 12 removed for illustrative purposes.

As will be described in more detail below, the tiered circuit board 10 electrically connects the connector 12 to conductors 22 (e.g., wires) of the cables 15 so that signals may be transferred between the connector 12 and the conductors 22 through the tiered circuit board 10. In one embodiment, a cable 15 may be implemented as a ribbon cable, such as a twinax ribbon cable, having multiple conductors 22 that can be appropriately positioned in bulk for connection to an interface. In this regard, the conductors 22 are embedded within an insulative sheath 7 that electrically isolates the conductors 22 from each other. Ends of the conductors 22 are exposed so that they can be individually connected (e.g., soldered) to a respective pad, as will be described in more detail below, or other electrical interfaces.

Notably, the connector 12 may be interfaced with a mating connector module (not shown in FIG. 3) that plugs into or is otherwise coupled to the connector 12 so that the signals propagating through the tiered circuit board 10 may be transmitted to or received from other devices. As an example, a line card plugged into the chassis (not shown in FIG. 3) may be electrically connected through the connector 12 for carrying signals between the line card and other devices at the other end of the cable 15.

At least one end 25 of the tiered circuit board 10 has edges 28 that are offset to form a series of steps 33 in the tiered circuit board 10 as shown by FIGS. 3 and 4. In the embodiment shown by FIGS. 3 and 4, opposite ends 25 of the board 10 form steps 33 as described, but any number of ends may be stepped in other embodiments. The embodiment of FIGS. 3 and 4 has three steps 33 formed in each end 25, but other numbers of steps 33 are possible in other embodiments.

In one embodiment, the tiered circuit board 10 is implemented as a multilayered printed circuit board (PCB) having conductive traces formed on the layers for providing conductive paths for the propagation of electrical signals through the board 10, including between the layers of the board 10. The exemplary embodiment of FIGS. 3 and 4 has three layers 36-38 where the edge 28 of each layer 36-38 is offset from the edge 28 of an adjacent layer in order to form a step 33. The tiered circuit board 10 can be fabricated by forming a generally-rectangular PCB (or a PCB of another shape) and then removing material at the ends of the PCB in order to form the stepped layers 36-38. Alternatively, each layer 36-38 may be sized as shown and then joined (e.g., glued or otherwise bonded) to the other layers in order to form the tiered circuit board 10 as shown. In other embodiments, other techniques for fabricating the tiered circuit board 10 are possible.

As shown by FIGS. 3 and 4, the connector 12 may be mounted on one of the layers 36 of the tiered circuit board 10. The connector 12 has a frame 41 that holds a plurality of conductive pins 42, which can be mated with conductive receptacles of another connector module (not shown) that plugs into or otherwise interfaces with the connector 12. As an example, each pin 42 may form a male component that mates with a female component of another connector module (not shown) when such other connector module is plugged into, mated, or otherwise interfaced with the connector 12. In the embodiment shown by FIGS. 3 and 4, the connector 12 is a conventional press-fit connector having rows and columns of pins 42. In other embodiments, other types of connectors 12 and connector components are possible.

Referring to FIGS. 3 and 4, the exemplary frame 41 has a flat floor 43 and pair of side walls 44 that extend vertically from the floor 43 at opposite ends of the floor 43. Each pin 42 is mounted in the floor 43 and extends above the surface of the floor 43 for connecting to components of another connector module (not shown). Note that each pin 42 passes through the floor 43 so that it extends underneath the floor 43 for electrically connecting to conductive components of the board 10, as will be described in more detail below. In this regard, referring to FIG. 6, each pin 42 has conductive arms 55 that extend beneath the floor 43, which is not shown in FIG. 6 for simplicity of illustration.

Figure 6:
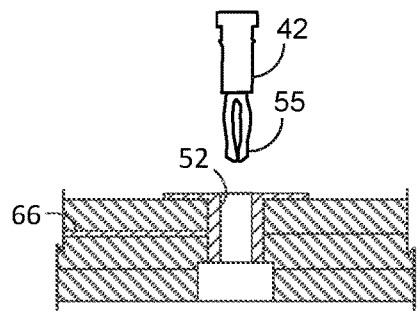
FIG. 6 is a cross-sectional view of a portion of the tiered circuit board depicted by FIG. 3.

The arms 55 of each pin 42 (FIG. 4) are inserted into a respective via 46 (FIG. 3 and FIG. 5) that is drilled through or otherwise formed in the tiered circuit board 10. As shown by FIG. 6, each via 46 is plated with a conductive material for carrying electrical signals, as will be described in more detail below. The arms 55 of the pin 42 that is inserted into a respective via 46 make electrical contact with a conductive wall 52 of the via 46. To enhance signal integrity, as much of the via 46 as possible may then be removed via a technique known in the industry as backdrilling, leaving only the portion required to ensure connectivity and mechanical stability of the pressfit pin. In other embodiments, other techniques and components for conductively coupling a pin 42 (or other component of a connector) to the wall 52 are possible.

As shown by FIG. 4, conductive pads 63 are formed on a surface of each step 33. Each conductive pad 63 may be electrically connected to a respective conductor 22 of a cable 15. In the embodiment shown by FIGS. 3 and 4, there are three ribbon cables 15 where each ribbon cable 15 has four conductors 22 electrically connected to a set of four conductive pads 63 on a respective step 33. As an example, each conductor 22 may be soldered to a respective pad 63. In other embodiments, other types of electrical connections between the pads 63 and the conductors 22 are possible, and other numbers of conductors 22 and pads 63 per ribbon cable 15 are possible. Note that FIGS. 3 and 4 show three ribbon cables 15 for simplicity of illustration, but the board 10 has conductive pads 63 for more cables 15. The board 10 may have any number of conductive pads 63 as may be desired.

Formed on each layer 36-38 are conductive traces 66 that run from the conductive pads 63 to the walls 52 of vias 46. Specifically, each conductive pad 63 is electrically connected to a wall 52 of a respective via 46 by a conductive trace 66 that runs horizontally from the pad 63 through the board 10 to the via's wall 52. Thus, each conductor 22 may be electrically connected to a respective pin 42 of the connector 12 through a conductive pad 63, a trace 66, and a wall 52 of a via 46. Therefore, an electrical signal carried by a conductor 22 passes through the tiered circuit board 10 between the conductor 22 and a pin 42 of the connector 12. Notably, a conductive trace 66 may run between layers of the board 10. As an example, a conductive trace 66 may be formed on a top surface of the layer 37 and pass between the top surface of the layer 37 and a bottom surface of the layer 36 to reach a wall 52 of a via 46 such that a portion of the trace 66 is hidden from view in FIGS. 4 and 5.

As shown by FIGS. 3 and 4, the tiered nature of the board 10 enables many cables 15 to be electrically coupled to the board 10 without requiring bends in the cables 15 near the board 10. Thus, it is possible to connect a large number of the ends of the cables 15 to the board 10 in a relatively small space without having to significantly bend the cables 15, taking up space and potentially compromise signal integrity. In addition, the tiered nature of the board 10 enables electrical connectivity to multiple layers of the PCB without requiring secondary vias, thereby avoiding many signal integrity and trace routing challenges. In addition to avoiding bend radii issues, the tiered nature facilitates compact connections by matching the tier step size to the thickness of the connecting cables in some embodiments The tiered circuit board 10 may be used to electrically connect the conductors 22 with various types of devices. As an example, ribbon cables 15 may be used to form a flexible backplane in a telecommunication system, such as a packet optical transport system, and the tiered circuit board 10 may be used as the interface for the system's switch fabric line card or other devices. However, in other embodiments, the tiered circuit board 10 may be used as an interface between other types of devices.

Figure 7:
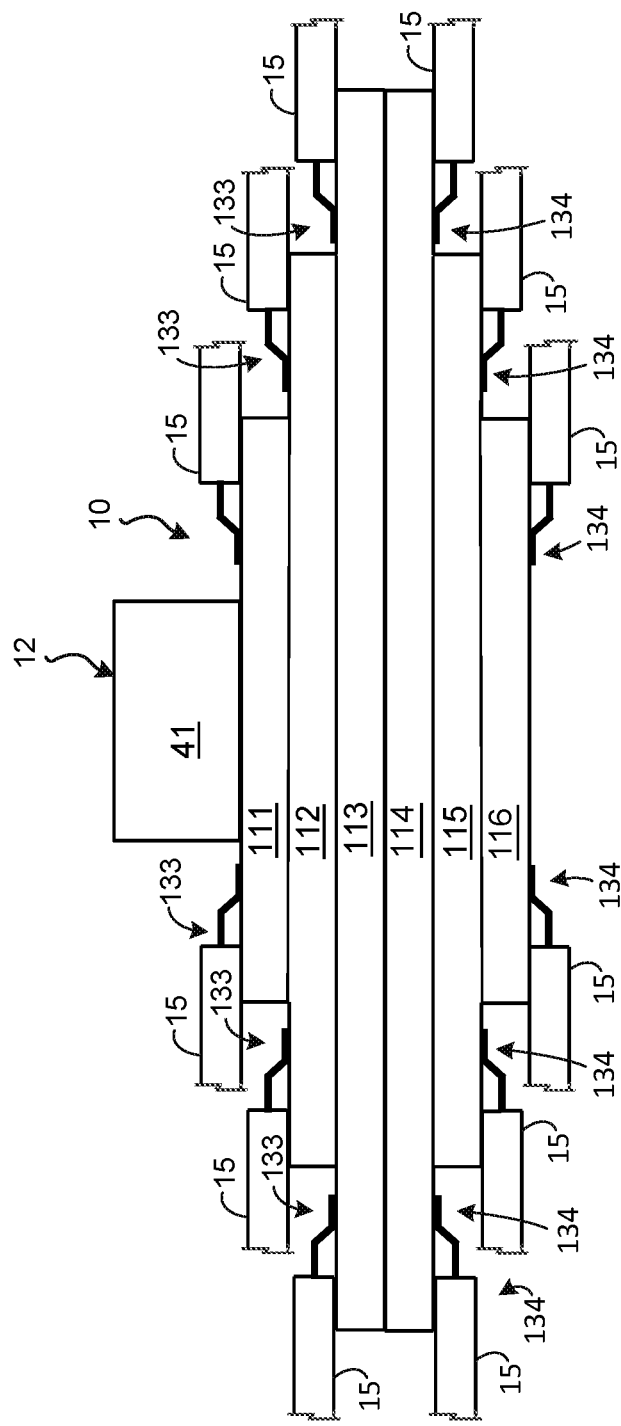
FIG. 7 is a side view illustrating an exemplary embodiment of a tiered circuit board for interfacing a plurality of conductors with a connector.

FIG. 7 depicts another embodiment of a tiered circuit board 100 similar to the embodiment shown by FIG. 3. In this regard, the tiered circuit board 100 has multiple layers 111-116 where the edges of the layers are offset in order to form steps, as described above. In the embodiment shown by FIG. 7, the width of the layers 111 is about the same as the width of layer 116, and the width of the layer 112 is about the same as the width of the layer 115. The layers 111-113 form a series of steps 133 on a top side of the board 100, and the layers 114-116 form a series of steps 134 on a bottom side of the board. Further, steps 133 and 134 are also formed on opposite ends of the board 100, as shown. By forming steps on the top and bottom of the board 100, as well as on multiple ends, the number of ribbon cables 15 and conductors 22 that can be electrically interfaced with the board 100 in a given space can be increased.

In several exemplary embodiments described above, conductive pads 63 are formed on the surfaces of layers (e.g., steps) for electrically coupling the tiered circuit board to conductors 22 of one or more cables 15. In other embodiments, other types of electrical interfaces may be used to make an electrical coupling between at least one conductor 22 and the tiered circuit board 10. Such electrical interfaces may be positioned on the stepped surfaces, as described above for the conductive pads 63, so that the conductors 22 may be similarly positioned as shown herein. In yet other embodiments, other changes and modifications would be apparent to a person of ordinary skill upon reading this disclosure.

Now, therefore, the following is claimed:

1. A system, comprising:
  a first cable having a first conductor and a second conductor;
  a second cable having a third conductor and a fourth conductor;
  a tiered circuit board having a first layer and a second layer, the first layer having a first edge and the second layer having a second edge that is offset relative to the first edge thereby forming a step in the tiered circuit board, the tiered circuit board having: (1) a first conductive pad and a second conductive pad formed on a surface of the first layer and (2) a third conductive pad and a fourth conductive pad formed on a surface of the second layer, wherein the first conductor is electrically coupled to the first conductive pad, the second conductor is electrically coupled to the second conductive pad, the third conductor is electrically coupled to the third conductive pad, and the fourth conductor is electrically coupled to the fourth conductive pad; and
  a connector mounted on the tiered circuit board, the connector electrically coupled to the first conductive pad, the second conductive pad, the third conductive pad, and the fourth conductive pad.

2. The system of claim 1, wherein the second cable is a twinaxial ribbon cable.

3. The system of claim 1, wherein the second cable is a twinaxial cable.

4. The system of claim 1, wherein the connector is a high-density, high-speed connector.

5. The system of claim 1, wherein the first conductor is soldered to the first conductive pad, and wherein the second conductor is soldered to the second conductive pad.

6. The system of claim 1, wherein the tiered circuit board has a via extending through at least the first layer, the via having a conductive wall, wherein the second conductive pad is electrically coupled to the conductive wall.

7. The system of claim 6, wherein the connector has a conductive pin electrically coupled to the conductive wall.

8. A system, comprising:
  a first cable having a first conductor;
  a second cable having a second conductor;
  a tiered circuit board having a first layer and a second layer, the first layer having a first edge and the second layer having a second edge that is offset relative to the first edge thereby forming a step in the tiered circuit board, the tiered circuit board having a first conductive pad formed on a surface of the first layer and a second conductive pad formed on a surface of the second layer, wherein the first conductor is electrically coupled to the first conductive pad, wherein the second conductor is electrically coupled to the second conductive pad, wherein the tiered circuit board has a via extending through at least the first layer, the via having a conductive wall, and wherein the second conductive pad is electrically coupled to the conductive wall; and
  a connector mounted on the tiered circuit board, the connector electrically coupled to the first conductive pad and to the second conductive pad and having a conductive pin electrically coupled to the conductive wall, wherein the pin is inserted into the via and contacts the conductive wall.

9. A tiered circuit board, comprising:
  a substrate having a first edge and a second edge, wherein the first edge is offset relative to the second edge forming a step in the substrate;
  a first electrical interface for electrically coupling to a first conductor of a first cable, the first electrical interface positioned on a surface of the step between the first edge and the second edge, wherein the surface of the step extends from the first edge;
  a second electrical interface for electrically coupling to a second conductor of the first cable, the second electrical interface positioned on a surface of the step between the first edge and the second edge;
  a third electrical interface for electrically coupling to a third conductor of a second cable, the third electrical interface positioned on a surface of the substrate, wherein the surface of the substrate extends from the second edge;
  a fourth electrical interface for electrically coupling to a fourth conductor of the second cable, the fourth electrical interface positioned on the surface of the substrate; and
  a connector coupled to the substrate, the connector electrically coupled to the first electrical interface, the second electrical interface, the third electrical interface, and the fourth electrical interface by the tiered circuit board.

10. A tiered circuit board, comprising:
  a substrate having a first edge, a second edge, and a third edge, wherein the first edge is offset relative to the second edge forming a first step in the substrate, and wherein the second edge is offset relative to the third edge forming a second step in the substrate;
  a first electrical interface for electrically coupling to a first conductor of a first cable, the first electrical interface positioned on a surface of the first step between the first edge and the second edge;
  a second electrical interface for electrically coupling to a second conductor of the first cable, the second electrical interface positioned on the surface of the first step;
  a third electrical interface for electrically coupling to a third conductor of a second cable, the third electrical interface positioned on a surface of the second step between the second edge and the third edge;
  a fourth electrical interface for electrically coupling to a fourth conductor of the second cable, the fourth electrical interface positioned on the surface of the second step; and
  a connector coupled to the substrate, the connector electrically coupled to the first electrical interface, the second electrical interface, the third electrical interface, and the fourth electrical interface by the tiered circuit board.

11. The tiered circuit board of claim 10, wherein the first electrical interface comprises a first conductive pad, and wherein the second electrical interface comprises a second conductive pad.

12. The tiered circuit board of claim 9, wherein the substrate has a via, wherein the via has a conductive wall, and wherein the first electrical interface is electrically coupled to the conductive wall.

13. A tiered circuit board, comprising:
a substrate having a via, a first edge, and a second edge, wherein the first edge is offset relative to the second edge forming a step in the substrate, and wherein the via has a conductive wall;
an electrical interface for electrically coupling to a conductor of a cable, the electrical interface positioned on a surface of the step between the first edge and the second edge, wherein the electrical interface is electrically coupled to the conductive wall; and
a connector coupled to the substrate, the connector electrically coupled to the electrical interface by the tiered circuit board, wherein the connector has a conductive pin electrically coupled to the conductive wall and wherein the pin is inserted into the via and contacts the conductive wall.

14. A method, comprising:
providing a tiered circuit board having a substrate, wherein the substrate has a first edge and a second edge, wherein the first edge is offset relative to the second edge forming a step in the substrate, wherein the substrate is coupled to a connector, wherein the connector is electrically coupled by the tiered circuit board to (1) a first electrical interface positioned on a surface of the step, (2) a second electrical interface positioned on the surface of the step, (3) a third electrical interface positioned on a surface of the substrate, and (4) a fourth electrical interface positioned on the surface of the substrate, wherein the surface of the step extends from the first edge, and wherein the surface of the substrate extends from the second edge;
connecting a first conductor of a first cable to the first electrical interface thereby electrically coupling the first conductor to the connector;
connecting a second conductor of the first cable to the second electrical interface thereby electrically coupling the second conductor to the connector;
connecting a third conductor of a second cable to the third electrical interface thereby electrically coupling the third conductor to the connector; and
connecting a fourth conductor of the second cable to the fourth electrical interface thereby electrically coupling the fourth conductor to the connector.

15. A method, comprising:
providing a tiered circuit board having a substrate with a first step and a second step formed in the substrate, wherein the substrate is coupled to a connector, wherein the connector is electrically coupled by the tiered circuit board to a first electrical interface positioned on a surface of the first step, wherein the connector is electrically coupled by the tiered circuit board to a second electrical interface positioned on the surface of the first step, wherein the connector is electrically coupled by the tiered circuit board to a third electrical interface positioned on a surface of the second step, and wherein the connector is electrically coupled by the tiered circuit board to a fourth electrical interface positioned on the surface of the second step;
connecting a first conductor of a first cable to the first electrical interface thereby electrically coupling the first conductor to the connector;
connecting a second conductor of the first cable to the second electrical interface thereby electrically coupling the second conductor to the connector;
connecting a third conductor of a second cable to the third electrical interface thereby electrically coupling the third conductor to the connector; and
connecting a fourth conductor of the second cable to the fourth electrical interface thereby electrically coupling the fourth conductor to the connector.

16. The method of claim 15, wherein the second cable is a twinaxial ribbon cable.

17. The method of claim 15, wherein the second cable is a twinaxial cable.

18. The method of claim 15, wherein the first electrical interface comprises a first conductive pad, and wherein the second electrical interface comprises a second conductive pad.

19. The method of claim 18, wherein the connecting the first conductor comprises soldering the first conductor to the first conductive pad, and wherein the connecting the second conductor comprises soldering the second conductor to the second conductive pad.

20. A method, comprising:
providing a tiered circuit board having a substrate with a step formed in the substrate, wherein the substrate is coupled to a connector, wherein the connector is electrically coupled by the tiered circuit board to an electrical interface positioned on a surface of the step, wherein the substrate has a via, wherein the via has a conductive wall, and wherein the electrical interface is electrically coupled to the conductive wall;
connecting a conductor of a cable to the electrical interface thereby electrically coupling the conductor to the connector; and
inserting a conductive pin of the connector such that the conductive pin contacts the conductive wall.

21. The tiered circuit board of claim 9, wherein the first electrical interface comprises a first conductive pad, and wherein the second electrical interface comprises a second conductive pad.

22. The tiered circuit board of claim 13, wherein the electrical interface comprises a conductive pad.

23. The method of claim 14, wherein the first electrical interface comprises a first conductive pad, and wherein the second electrical interface comprises a second conductive pad.

24. The system of claim 1, wherein the connector has a frame for holding a plurality of conductive pins, wherein each of the conductive pins passes through the frame and has a first end and a second end on opposite sides of the frame, the first end for mating with a conductive receptacle of a connector module that is interfaced with the connector, wherein the second end is inserted into a respective via passing through the tiered circuit board and contacts a conductive wall of the via.

25. The system of claim 1, wherein the first cable is coupled to a device off of the tiered circuit board for carrying signals between the device and at least the first conductive pad and the second conductive pad.

26. The system of claim 25, wherein the first conductor contacts the first conductive pad, wherein the second conductor contacts the second conductive pad, wherein the third conductor contacts the third conductive pad, and wherein the fourth conductor contacts the fourth conductive pad.

27. The system of claim 1, wherein the tiered circuit board has a via formed in the first layer, wherein the tiered circuit board has a conductive trace formed on the surface of the second layer that runs from the third conductive pad to a conductive wall of the via, wherein the connector is electrically coupled to the conductive trace and the conductive wall and is positioned on the tiered circuit board such that the conductive trace and the conductive wall carry a signal between the connector and the third conductive pad, and wherein the connector is a connector for receiving a mating connector module.

28. The system of claim 27, wherein the connector is a press-fit connector.

\* \* \* \* \*